(12) United States Patent
Zanchi et al.

(10) Patent No.: US 10,705,552 B1
(45) Date of Patent: Jul. 7, 2020

(54) SELF-OPTIMIZING CIRCUITS FOR MITIGATING TOTAL IONIZING DOSE EFFECTS, TEMPERATURE DRIFTS, AND AGING PHENOMENA IN FULLY-DEPLETED SILICON-ON-INSULATOR TECHNOLOGIES

(71) Applicant: THE BOEING COMPANY, Chicago, IL (US)

(72) Inventors: Alfio Zanchi, Huntington Beach, CA (US); Jeffrey Maharrey, Mountlake Terrace, WA (US); Manuel F. Cabanas-Holmen, McKenna, WA (US); Roger Brees, Issaquah, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/588,315

(22) Filed: Sep. 30, 2019

Related U.S. Application Data

(60) Provisional application No. 62/871,532, filed on Jul. 8, 2019.

(51) Int. Cl.
| | |
|---|---|
| *H03K 19/094* | (2006.01) |
| *G05F 3/20* | (2006.01) |
| *H01L 27/02* | (2006.01) |
| *H03F 1/02* | (2006.01) |
| *H03F 3/45* | (2006.01) |
| *G05F 3/22* | (2006.01) |

(52) U.S. Cl.
CPC .............. *G05F 3/205* (2013.01); *G05F 3/222* (2013.01); *H01L 27/0218* (2013.01); *H03F 1/0205* (2013.01); *H03F 3/45475* (2013.01)

(58) Field of Classification Search
None
See application file for complete search history.

(56) References Cited

U.S. PATENT DOCUMENTS

| 4,670,670 A | 6/1987 | Shoji |
|---|---|---|
| 7,327,166 B2 | 2/2008 | Zanchi et al. |
| | (Continued) | |

OTHER PUBLICATIONS

K.A. Bowman, C. Tokunaga, J.W. Tschanz, T. Karnik, and V.K. De, "Adaptive and Resilient Circuits for Dynamic Variation Tolerance", IEEE Design & Test, vol. 30, No. 6, pp. 8-17, 2013.

(Continued)

*Primary Examiner* — Anh Q Tran
(74) *Attorney, Agent, or Firm* — Armstrong Teasdale LLP

(57) ABSTRACT

A self-optimizing circuit for a FD-SOI device includes a static biasing circuit, a dosimeter, a reference circuit, an amplifier, a voltage source, and a feedback circuit. The static biasing circuit supplies a first bias. The dosimeter includes a dosimeter FD-SOI device and generates a dosimeter voltage sensitive to parametric shifts in the primary FD-SOI device. The reference circuit supplies a reference voltage. The amplifier is coupled to the dosimeter and the reference circuit, and supplies a second bias at an output of the static biasing circuit, the second bias proportional to a difference between the dosimeter voltage and the reference voltage. The voltage source generates a drive voltage to which the first bias and the second bias are referenced. The feedback circuit regulates supply of the drive voltage to a well of the dosimeter FD-SOI device according to the first bias and the second bias.

20 Claims, 6 Drawing Sheets

(56) References Cited

U.S. PATENT DOCUMENTS

2018/0191346 A1* 7/2018 Jensen .................. H03F 3/181
2019/0280688 A1* 9/2019 Ruffieux ............... H03K 3/011

OTHER PUBLICATIONS

G. Ono and M. Miyazaki, "Threshold-voltage balance for minimum supply operation", IEEE Journal of Solid-State Circuits, vol. 38, No. 5, pp. 830-833, May 2003.

L.T. Clark, D. Kidd, V. Agrawal, S. Leshner, and G. Krishnan, "Independent N and P process monitors for body bias based process corner correction", Proceedings of the IEEE 2014 Custom Integrated Circuits Conference, pp. 1-4, 2014.

G. Ono, M. Miyazaki, K. Watanabe, and T. Kawahara, "An LSI system for locked in temperature insensitive state achieved by using body bias techniques", Proceedings of IEEE International Symposium on Low Power Electronics and Design, pp. 48-53, Aug. 1998.

K.C. Mohr, L.T. Clark, and K.E. Holbert, "A 130-nm RHBD SRAM with high speed Set and area efficient TID mitigation", IEEE Transactions on Nuclear Sciences, vol. 54, No. 6, Dec. 2007.

M. Gaillardin, M. Martinez, P. Paillet, M. Raine, F. Andrieu, O. Faynot, and O. Thomas, "Total Ionizing Dose effects mitigation strategy for nanoscaled FDSOI technologies", IEEE Transactions on Nuclear Sciences, vol. 61, No. 6, Dec. 2014.

N. Kamae, A.K.M. Mahfuzul Islam, A. Tsuchiya, and H. Onodera, "A body bias generator with wide supply-range down to threshold voltage for within-die variability compensation", IEEE Asian Solid-State Circuits Conference (A-SSCC), pp. 53-56, 2014.

R. Ranica, N. Planes, O. Weber, O. Thomas, S. Haendler, D. Noblet, D. Croain, C. Gardin, and F. Arnaud, "FDSOI process/design full solutions for ultra-low leakage, high speed and low voltage SRAMs," in Proceedings of the Symposium on VLSI Technologies, pp. 210-211, Jun. 2013.

J.K. Shreedhara, H.J. Barnaby, B.L. Bhuva, D.V. Kerns, and S.E Kerns, "Circuit technique for threshold voltage stabilization using substrate bias in Total Dose environments", IEEE Transactions on Nuclear Sciences, vol. 47, No. 6, Dec. 2000.

A. Ohata, Y. Bae, C. Fenouillet-Beranger, and S. Cristoloveanu, "Mobility enhancement by backgate biasing in ultrathin SOI MOSFETs with thin BOX", IEEE Electron Device Letters, vol. 33, No. 3, Mar. 2012.

W. Shu, J. Jiang, K.S. Chong, and J. Chang, "Radiation Hardening by Design Integrated Circuits Enabling Low-Cost Satellites for Internet-of-Things", IEEE 23rd International Conference on Digital Signal Processing (DSP), pp. 1-4, 2018.

\* cited by examiner

SELF-OPTIMIZING CIRCUITS FOR MITIGATING TOTAL IONIZING DOSE EFFECTS, TEMPERATURE DRIFTS, AND AGING PHENOMENA IN FULLY-DEPLETED SILICON-ON-INSULATOR TECHNOLOGIES

CROSS-REFERENCE TO RELATED APPLICATION

This Application claims priority to U.S. Provisional Patent Application No. 62/871,532 titled "Self-Optimizing Circuits for Mitigating Total Ionizing Dose Effects, Temperature Drifts, and Aging Phenomena in Fully-Depleted Silicon-on-Insulator Technologies," filed Jul. 8, 2019, and listing Alfio Zanchi et al. as inventors, the entire contents of which are hereby incorporated herein by reference.

FIELD

The field of the disclosure relates generally to self-optimizing circuits and, more specifically, to self-optimizing circuits for mitigating Total Ionizing Dose (TID) effects, temperature drifts, and aging phenomena in Fully-Depleted Silicon-On-Insulator (FD-SOI) technologies.

BACKGROUND

Many electrical systems, including, for example, control systems and measurement devices, rely on Fully-Depleted Silicon-On-Insulator (FD-SOI) semiconductors for some aspect of operation. FD-SOI is a category of semiconductor devices manufactured such that a thin layer of insulator, often silicon oxide, is positioned between the silicon channel and the base silicon. The thin layer of insulator is generally referred to as the buried oxide, or BOX, and enables use of a very thin layer, or film, of un-doped silicon as the channel, which results in the channel being fully depleted during normal operation.

Certain physical phenomena, such as radiation, may introduce parametric shifts in semiconductors that can ultimately produce failures or, for example, errors in data. These parametric shifts are similar to those known to occur due to temperature and age. Although previously thought to be relatively insensitive to radiation, FD-SOI semiconductors accumulating a high-enough total ionizing dose (TID) of radiation may exhibit parametric shifts. At least some FD-SOI semiconductors include one or more wells positioned below the BOX that can be charged, or biased, to partially mitigate parametric shifts. However, biasing of the wells is generally fixed by design or is itself susceptible to parametric shifts, resulting in sub-optimized compensation. In certain applications, such as satellites, aerial vehicles, and long-range guided vehicles, the accuracy of FD-SOI circuits is desirable, because even small parametric shifts (i.e., errors) translate to errors in acceleration, position, and rotation. Accordingly, it would be desirable to enhance the degree of compensation against at least TID, aging, and temperature effects in FD-SOI semiconductors.

BRIEF DESCRIPTION

One aspect includes a self-optimizing circuit for a primary fully-depleted silicon-on-insulator (FD-SOI) device having a buried oxide layer (BOX) and a primary well disposed beneath the BOX. The self-optimizing circuit includes a static biasing circuit configured to supply a first, or static, bias. The self-optimizing circuit includes a total ionizing dose (TID) dosimeter comprising a dosimeter FD-SOI device. The TID dosimeter is configured to generate a dosimeter voltage sensitive to parametric shifts in the primary FD-SOI device. The self-optimizing circuit includes a reference circuit configured to supply an invariant reference voltage. The self-optimizing circuit includes an amplifier coupled to the TID dosimeter and the reference circuit, the amplifier configured to supply a second, or dynamic, bias at an output of the static biasing circuit, the second bias proportional to a difference between the dosimeter voltage and the reference voltage. The self-optimizing circuit includes a voltage source configured to generate a drive voltage to which the first bias and the second bias are referenced. The self-optimizing circuit includes a feedback circuit configured to regulate supply of the drive voltage to a well of the dosimeter FD-SOI device according to the first bias and the second bias.

Another aspect includes a method of compensating a primary FD-SOI device for TID effects. The primary FD-SOI device includes a BOX and a primary well disposed beneath the BOX. The method includes determining a static bias. The method includes detecting, by a TID dosimeter, a parametric shift in the primary FD-SOI device and generating a differential output representative thereof. The method includes determining a dynamic bias based on the differential output. The method includes supplying a drive voltage for the static bias and the dynamic bias. The method includes regulating the drive voltage to produce the static bias and the dynamic bias. The method includes applying the static bias and the dynamic bias to a well of a FD-SOI device of the TID dosimeter. The method includes applying the static bias and the dynamic bias to the primary well of the primary FD-SOI device.

Another aspect of the present disclosure includes a self-optimizing, or "back-biasing," circuit including a charge pump, a dosimeter, a first amplifier, a second amplifier, a well control unit, and a replica well control unit. The charge pump is for generating a voltage within a well. The dosimeter is for detecting parametric shifts in a FD-SOI circuit. The first amplifier is coupled to the charge pump. The second amplifier is coupled to the charge pump, the first amplifier, and the dosimeter. The well control unit is coupled to the first amplifier and the second amplifier. The replica well control unit is coupled to the first amplifier and the second amplifier. The charge pump, the first amplifier, the well control unit, and the replica well control unit form a first feedback loop for establishing a static bias. The charge pump, the dosimeter, the second amplifier, the well control unit, and the replica well control unit form a second feedback loop for compensating for parametric shifts detected by the dosimeter. The first and second feedback loops counter parametric shifts in the FD-SOI circuit caused by at least one of radiation, temperature drifts, and aging phenomena.

Another aspect of the present disclosure includes a dosimeter for detecting parametric shifts in a FD-SOI circuit. The dosimeter includes a plurality of resistors, a transistor, a first branch, a second branch, and an amplifier. The resistors are substantially invariant to the effects caused by radiation. The transistor is sensitive to the effects caused by radiation. The first branch has a first dosimeter node positioned between two of the resistors. The second branch has a second dosimeter node positioned between a resistor of the plurality of resistors and the transistor. The amplifier has a positive input coupled to the second dosimeter node and a negative input coupled to the first dosimeter node. An output of the amplifier is an output of the dosimeter and it is coupled to the top node of both branches. The bottom node of both branches is coupled to a ground voltage. Radiation causes parametric shifts within the dosimeter and a potential shift at the output of the dosimeter.

Yet another aspect of the present disclosure includes an aerial vehicle including a self-optimizing, or "back-biasing," circuit including a charge pump, a dosimeter, a first amplifier, a second amplifier, a well control unit, and a replica well control unit. The charge pump is for generating a voltage within a well. The dosimeter is for detecting parametric shifts in a FD-SOI circuit. The first amplifier is coupled to the charge pump. The second amplifier is coupled to the charge pump, the first amplifier, and the dosimeter. The well control unit is coupled to the first amplifier and the second amplifier. The replica well control unit is coupled to the first amplifier and the second amplifier. The charge pump, the first amplifier, the well control unit, and the replica well control unit form a first feedback loop for establishing a static bias. The charge pump, the dosimeter, the second amplifier, the well control unit, and the replica well control unit form a second feedback loop for compensating for parametric shifts detected by the dosimeter. The first and second feedback loops counter parametric shifts in the FD-SOI circuit caused by at least one of radiation, temperature drifts, and aging phenomena.

The features, functions, and advantages that have been discussed can be achieved independently in various embodiments or may be combined in yet other embodiments, further details of which can be seen with reference to the following description and drawings.

DETAILED DESCRIPTION

Figure 1:
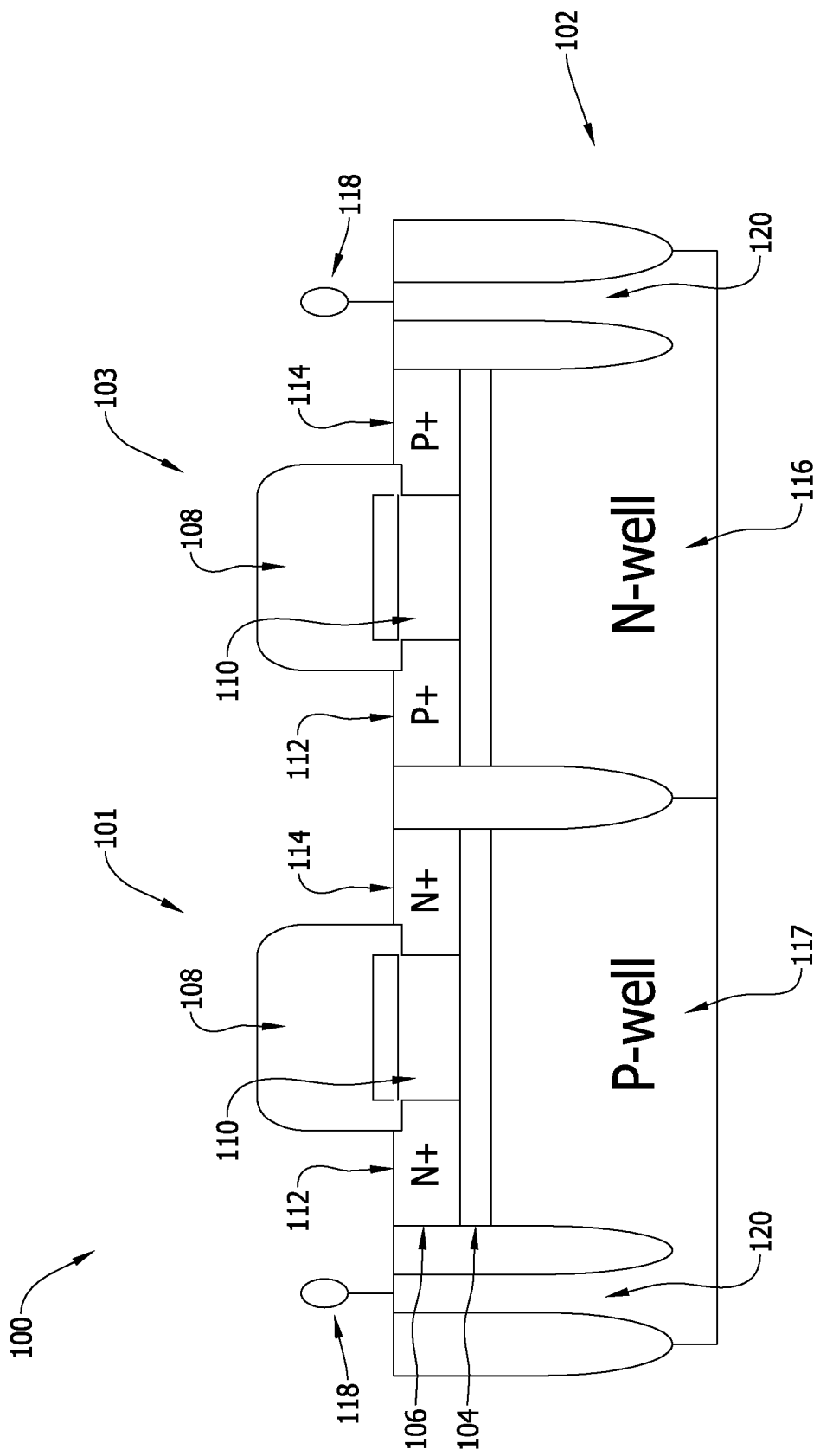
FIG. 1 is a cross-sectional view of an example of a FD-SOI wafer on which FD-SOI semiconductor devices are formed.

As used herein, an element or step recited in the singular and preceded by the word "a" or "an" should be understood as not excluding plural elements or steps unless such exclusion is explicitly recited. Furthermore, references to "one embodiment" of the present invention or the "example embodiment" are not intended to be interpreted as excluding the existence of additional embodiments that also incorporate the recited features.

FD-SOI semiconductors exposed to the cumulative effects of radiation over time, as quantified by TID, exhibit parametric shifts due to the influence of charge trapped within the BOX on the channel region of active devices, such as Field Effect Transistors (FETs). Embodiments of the self-optimizing circuits described herein provide biasing, or "back biasing," of the well beneath the BOX to compensate for the effects of at least, for example, radiation, but also for temperature or age. At least some embodiments of the self-optimizing circuits provide both a static biasing and a dynamic biasing of the well that acts in a proportional and opposite manner to the trapped charge in the BOX, to compensate for the parametric shift.

Generally, known solutions provide a fixed, or static, biasing of the wells to compensate for parametric shifts. Some such solutions, devised, for example, to control device leakage rather than improve circuit performance, may include techniques of multiple discrete biasing steps, such as zero bias, reverse body bias (RBB), and RBB plus supply collapse (RBB+SC). Static biasing is generally determined to optimize for average leakage performance. However, the accumulation of TID influences parametric shifts dynamically over time, making the application of such static biasing alone sub-optimal. Embodiments of the self-optimizing circuits described herein mitigate parametric shifts due to TID dynamically, or adaptively, as they manifest in the integrated circuit.

Further, in some embodiments, PMOS and NMOS devices may utilize the same wells. In other embodiments, PMOS and NMOS devices utilize independent wells. In certain embodiments, different regions of devices or devices performing different functions utilize different wells, and in other embodiments, PMOS and NMOS devices utilize different wells and further utilize different wells for different regions of devices or devices performing different functions. Each of these different wells for different devices, different regions of devices, or devices performing different functions may be biased and optimized independently using one or more of the self-optimizing circuits described herein.

At least some known solutions utilize digital circuits, such as a DSP or an eFPGA, to make digital adjustments to static biasing of the wells. Embodiments of the self-optimizing circuits described herein utilize an analog feedback loop to regulate the potential of the wells to compensate for parametric shift dynamically, thereby eliminating the need for digital circuits and processing devices. The analog feedback includes a reference circuit to establish an optimal set-point for the overall self-optimizing circuit loop, and a TID dosimeter that replicates the FD-SOI devices under regulation to produce an "error" signal representing the parametric shift being experienced. Thus, the self-optimizing circuit continuously regulates the well potentials under the BOX based on the parametric shifts observed in the dosimeter devices.

At least some embodiments of the self-optimizing circuits described herein utilize a charge pump circuit out of the control loop to regulate the potential of the wells beneath the BOX. Some known techniques for body-biasing utilized charge pumping, but also either included the charge pump in the loop (which may experience longer recovery transients, with and without experiencing a radiation event), or utilized active components in the control feedback path (which would experience parametric shift themselves due to, for example, TID).

FIG. 1 is a cross-sectional view of one embodiment of a FD-SOI wafer 100 having an nMOS semiconductor device 101 and a pMOS semiconductor device 103. FD-SOI wafer 100 includes a base silicon layer 102, a buried oxide layer (BOX) 104, and a silicon film 106. BOX 104 is positioned on base silicon layer 102 between base silicon layer 102 and silicon film 106. BOX 104 is an insulating layer formed on base silicon layer 102 for electrically isolating active semiconductor devices, such as nMOS semiconductor device 101 and pMOS semiconductor device 103, from base silicon layer 102. In certain embodiments, BOX 104 includes silicon dioxide and/or sapphire. In alternative implementations, BOX 104 may include any material that enables FD-SOI semiconductor 100 to operate as described herein.

Gates 108 are positioned over silicon film 106. Silicon film 106 is doped to define a fully-depleted channel 110 between a source 112 and a drain 114, thereby forming nMOS semiconductor device 101 and pMOS semiconductor device 103, i.e., transistors. Within each of the transistors, BOX 104 reduces parasitic capacitance of source 112 and drain 114, and efficiently confines electron flow from source 112 to drain 114, thereby reducing performance-degrading leakage currents into base silicon layer 102. FD-SOI wafer 100 also includes wells 116 and 117 defined within base silicon layer 102 beneath BOX 104. Wells 116 and 117 are respectively doped to form well 116 as an N-well beneath pMOS semiconductor device 103, and to form well 117 as a P-well beneath nMOS semiconductor device 101. Wells 116 and 117 are charged, or biased, via respective contacts 118 and contact channels 120. Notably, the type (e.g., p-type or n-type) and differentiation style of wells 116 and 117 may vary across different FD-SOI technologies. However, the manner in which wells 116 and 117 are biased according to the embodiments described herein applies equally across such FD-SOI technologies.

Wells 116 and 117 are biased against a change in the charge equilibrium (that results in parametric shifts) of nMOS semiconductor device 101 and pMOS semiconductor device 103, due to charge trapped in BOX 104 as a result of TID. Generally, as TID accumulates over time, the level of biasing correction imparted over wells 116 and 117 necessary to mitigate the effects of the parametric shift increases. For example, as a voltage threshold of gate 108 for nMOS semiconductor device 101 shifts due to trapped charge at the interface of BOX 104 and fully-depleted channel 110, an equal and opposite charge, i.e., biasing, is applied to well 117 via its respective contact 118 and contact channel 120, thereby compensating for the parametric shift and returning the nMOS semiconductor device 101 to, or near to, its original calibrated state. Likewise, as the voltage threshold of gate 108 for nMOS semiconductor device 101 shifts due to trapped charge at the interface between gate 108 and fully-depleted channel 110, a proportional and opposite biasing is applied to well 117 to compensate for the parametric shift. Notably, given the physical separation of gate 108 and BOX 104, the level of biasing of well 117 is proportional—rather than equal to—the shift in threshold voltage, in order to produce a sufficient electric field in well 117 to counterbalance the charge at the interface of gate 108 and fully-depleted channel 110.

Figure 2:
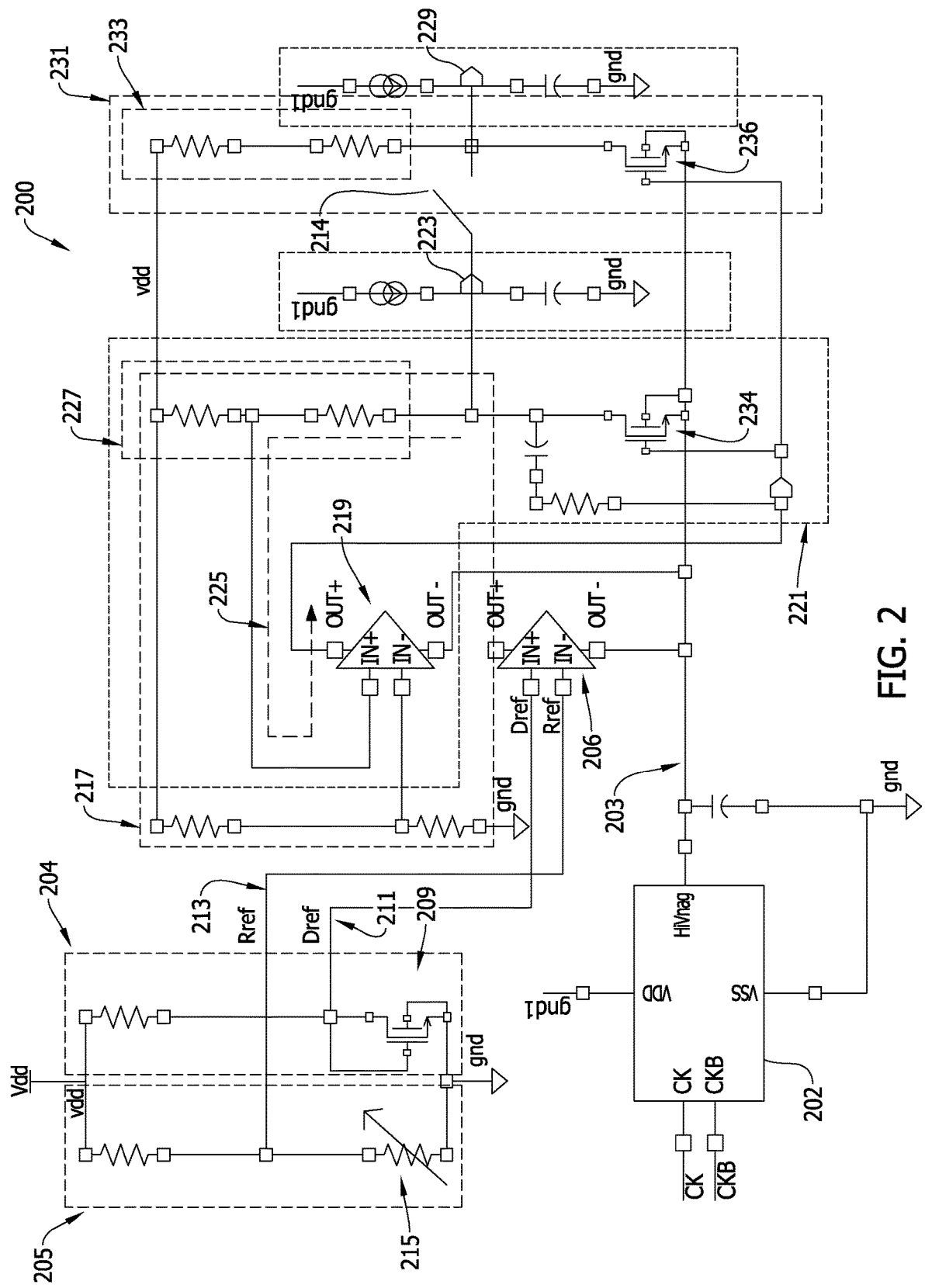
FIG. 2 is a schematic diagram of one implementation of a self-optimizing circuit for use with the FD-SOI semiconductor devices shown in FIG. 1.

FIG. 2 is a schematic diagram of one implementation of a self-optimizing circuit 200 for a FD-SOI semiconductor device under optimization. The FD-SOI semiconductor device may be, for example, one or more semiconductor devices, such as nMOS semiconductor device 101 or pMOS semiconductor device 103 shown in FIG. 1.

Self-optimizing circuit 200 includes a charge pump 202 or other voltage source, a dosimeter 204, and a reference circuit 205. Charge pump 202 is a clocked charge pump that generates a charge pump voltage at its output 203 that can be set to above the supply voltage (VDD) for self-optimizing circuit 200, or below ground-level voltage (VSS) for self-optimizing circuit 200. Notably, charge pump 202 is not actively controlled by any circuit other than a stationary clock or clocking circuit that may be incorporated within self-optimizing circuit 200 or provided independent thereof.

Dosimeter 204 and reference circuit 205 are connected in a bridge configuration between the supply voltage (VDD) and ground, and together produce a differential output to an operational transconductance amplifier (OTA) 206. Dosimeter 204 includes a FD-SOI transistor 209, having a well beneath its BOX (such as wells 116 and 117 and BOX 104 shown in FIG. 1), that is similarly sensitive to TID as all of the FD-SOI semiconductor devices under optimization. Otherwise, the components of dosimeter 204 and reference circuit 205 are generally insensitive to radiation. The bridge configuration of dosimeter 204 and reference circuit 205 generally produces an equal voltage division of the supply voltage (VDD) under zero TID, which is to say an output from dosimeter 204, or the dosimeter voltage 211, is equal to an output from reference circuit 205, or the reference voltage 213. Reference circuit 205 includes a calibration resistance 215 to enable an initial calibration of the voltage divider within reference circuit 205 to the zero TID state of FD-SOI transistor 209 in dosimeter 204. Otherwise, the voltage divider within reference circuit 205 produces a reference voltage 213 that is substantially invariant with respect to radiation, temperature, or age. As TID accumulates, reference voltage 213 functions as a set-point against which the dosimeter voltage 211 is compared to produce an error signal, or the differential voltage, that controls OTA 206.

In the embodiment shown in FIG. 2, the gate of FD-SOI transistor 209 is coupled to its drain, thereby configuring it, functionally, as a diode having a gate-to-source voltage ($V_{GS}$) that is sensitive to both MOS transistor voltage threshold shifts and mobility shifts within its fully-depleted channel. The voltage $V_{GS}$, when FD-SOI transistor 209 is in saturation, is expressed as:

$$V_{GS} = V_{TH} + \sqrt{2 \cdot I_{DS} \cdot L/W \cdot \mu_N \cdot C_{ox}} \qquad \text{EQ. 1}$$

Where, $V_{TH}$ is the MOS threshold voltage, $I_{DS}$ is the drain-to-source (or, channel) current flowing in the device, W and L are respectively the width and length of the silicon channel (e.g. 110 in FIG. 1), $\mu_N$ is the carrier mobility within the channel, and $C_{OX}$ is the gate oxide capacitance per unit area, of transistor 209.

Accordingly, due to the stability, or substantial invariance, of resistors within reference circuit 205 and dosimeter 204 to radiation (or aging, or temperature) effects as compared to FD-SOI transistor 209, any imbalance exhibited between the respective outputs of dosimeter 204 and reference circuit 205, i.e., between the dosimeter voltage 211 and the reference voltage 213, can be attributed to parametric shifts experienced by FD-SOI transistor 209 as a result of radiation (or aging, or temperature) effects. Such imbalance, i.e., the differential output of the bridge configuration of dosimeter 204 and reference circuit 205, is used by self-optimizing circuit 200 to control OTA 206 and thereby dynamically regulate the biasing of both the well of FD-SOI transistor 209 in dosimeter 204 and the well of the FD-SOI semiconductor devices under optimization (not shown in FIG. 2, but optimized via biasing applied to node 229). OTA 206 produces an output current, or bias, that is referenced to the charge pump voltage produced at the output 203 of charge pump 202. The bias produced by OTA 206 is supplied to the wells beneath FD-SOI transistor 209 and the FD-SOI semiconductor devices under optimization. Accordingly, the biasing of the well of FD-SOI transistor 209 restores the potential balance, or equilibrium between the dosimeter voltage 211, or VGS, and the reference voltage 213. Dosimeter 204 captures parametric aspects such as shifts due to radiation, temperature, or age that likewise are experienced over time by the FD-SOI semiconductor device in dosimeter 204, or one or more other devices that are under optimization. The feedback loop as described is governed by dosimeter 204 output as compared to the output of reference circuit 205, thereby enabling compensation for such shifts by dynamically regulating the potential of their respective wells (not shown in FIG. 2) over that time.

Self-optimizing circuit 200 further includes a static biasing circuit 217 configured to produce an output current that is added to the output current generated by OTA 206 and supplied to wells beneath FD-SOI transistor 209 and the FD-SOI semiconductor devices under optimization. Accordingly, even with a zero TID, static biasing circuit 217 enables self-optimizing circuit 200 to provide an optimal non-zero biasing of the wells beneath FD-SOI transistor 209 and the FD-SOI semiconductor devices under optimization. For example, in one embodiment, static biasing circuit 217 applies a −1.4V bias to the wells beneath FD-SOI transistor 209 and the FD-SOI semiconductor devices under optimization. In other embodiments, the optimal static bias may be set from about ±1.5V to about ±2.2V, depending on specific technology and circuit operation. Static biasing circuit 217 includes an OTA 219 controlled by a plurality of resistors coupled to supply a static reference voltage, defined by the supply voltage (VDD) and the ratios of resistive values of the plurality of resistors, to a negative input of OTA 219; and a feedback signal from the static regulation loop, coupled to a positive input of OTA 219. The output of OTA 219 is referenced to the charge pump voltage produced at the output 203 of charge pump 202, and is coupled with the output of OTA 206. The combined current produced by OTA 206 and OTA 219, both referenced to the charge pump voltage, is supplied to the wells beneath FD-SOI transistor 209 and the FD-SOI semiconductor devices under optimization.

Self-optimizing circuit 200 includes a low-dropout (LDO) regulator 221 configured to regulate the voltage applied to the well beneath FD-SOI transistor 209 at a dosimeter well node 223. LDO regulator 221 utilizes the charge pump voltage supplied at output 203 of charge pump 202 as a voltage input at the source of a transistor 234, the gate of which is controlled by the combined output from OTA 206 and OTA 219. The output voltage of LDO regulator 221, at the source of transistor 234, is supplied to the dosimeter well node 223. LDO regulator 221 includes a feedback path 225 via a voltage divider 227 to OTA 219. Accordingly, the output from OTA 219 functions as an error signal representing a differential between the voltage on feedback path 225 and the supply voltage (VDD) scaled through the radiation-insensitive resistive partition of static biasing circuit 217.

Charge pump 202 is operated by a system clock such that it can normally supply a constant voltage above the supply voltage (VDD) or below ground voltage (GND). For example, in certain embodiments, charge pump 202 generates a constant + or −3V. LDO regulator 221 subsequently regulates the charge pump voltage as it is applied to the dosimeter well node 223 by closing its feedback path 225 via the differential input to OTA 219 in static biasing circuit 217.

In certain embodiments, self-optimizing circuit 200 includes a switch 214 that enables or disables the independent regulation of the well potential beneath FD-SOI transistor 209 in dosimeter 204, and of the well potential in the FD-SOI semiconductor devices under optimization. When closed, switch 214 links the well potentials at dosimeter well node 223 and a device well node 229 that represents the potential of the well beneath the FD-SOI semiconductor device under optimization, enabling a precise regulation of the well node 229 as it remains closed in the loop.

When opened, switch 214 decouples the well potentials, forcing device well node 229 to track dosimeter well node 223 only indirectly, by virtue of device well node 229 being coupled at the output of a replica LDO regulator driver stage 231 having a transistor 236 and voltage divider 233, precisely ratioed to transistor 234 and voltage divider 227, i.e., the driver stage of LDO regulator 221. Notably, voltage dividers 227 and 233 have identical ratios and are purely resistive to limit any TID, temperature, or age effects in the feedback path of LDO regulator 221 or LDO driver stage 231, thereby maintaining feedback path 225, and the operation of the overall self-optimizing circuit 200, as insensitive to TID, temperature, and age effects as possible. Accordingly, LDO regulator 221 and replica LDO driver stage 231 regulate the biasing of the wells via dosimeter well node 223 (for the local well) and device well node 229 (for the larger well of the whole device under optimization), compensating for parametric shifts in the $V_{GS}$ voltage of FD-SOI transistor 209 in dosimeter 204, and at least similarly in the FD-SOI semiconductor device under optimization.

When switch 214 is closed, the well beneath the FD-SOI semiconductor device under optimization is incorporated into the control loop of self-optimizing circuit 200, along with the well beneath FD-SOI transistor 209 of dosimeter 204. Under such operation, although the voltage applied at device well node 229 is more tightly and directly controlled, the capacitive loading of the "combined" well is generally unknown. Therefore, it can destabilize the control loop by adding poles that subtract phase margin to the loop gain, causing undesired voltage ringing (e.g., upon Single Event Effect, or heavy-ion radiation strikes). These disadvantages can be addressed with a pole-zero cancellation technique, or via corresponding gain reductions in OTA 206 and OTA 219. Additionally, the leakage current of the combined well may accumulate such that it may interfere with precision of feedback path 225. In certain embodiments, the leakage current may grow to multiple microamperes, as it varies exponentially with temperature. Given the potential size of the well beneath the FD-SOI semiconductor device or devices under optimization, the leakage current can introduce a significant offset bias that may, in certain circumstances, overcome the capacity of charge pump 202 and render the biasing function of self-optimizing circuit 200 inoperative.

Conversely, when switch 214 is opened, LDO regulator 221 and replica LDO driver stage 231 operate independently. Moreover, replica LDO driver stage 231 itself can be replicated multiple times to provide an independent, more flexible regulation of the potential of fragmented wells of various FD-SOI semiconductor devices under optimization. Similarly, charge pump 202 may be replicated to further isolate the driving capacity of the wells beneath the FD-SOI semiconductor devices under optimization, from the local driving capacity for the well of FD-SOI transistor 209 in dosimeter 204, reducing undesirable noise and interference effects. In an alternative embodiment, charge pump 202 may be designed such that it is rated for greater capacity, e.g., 20-30% greater than the theoretical (±) $V_{DS}$+Vwell voltage required for operating LDO regulator 221 and replica LDO driver stage 231.

In an alternative embodiment, the driver stages of the LDO loop are modified to include a level-shifting servo driver operating as the voltage source. In certain embodiments, the level-shifting servo driver may simplify the implementation of OTA 206 and OTA 219, because the correct voltage level coupled to the gates of transistors 234 and 236 is translated by the level shifters. Accordingly, simpler single-supply amplifiers can then be referenced to a common ground instead of to the charge pump voltage generated at output 203 of charge pump 202.

Figure 3:
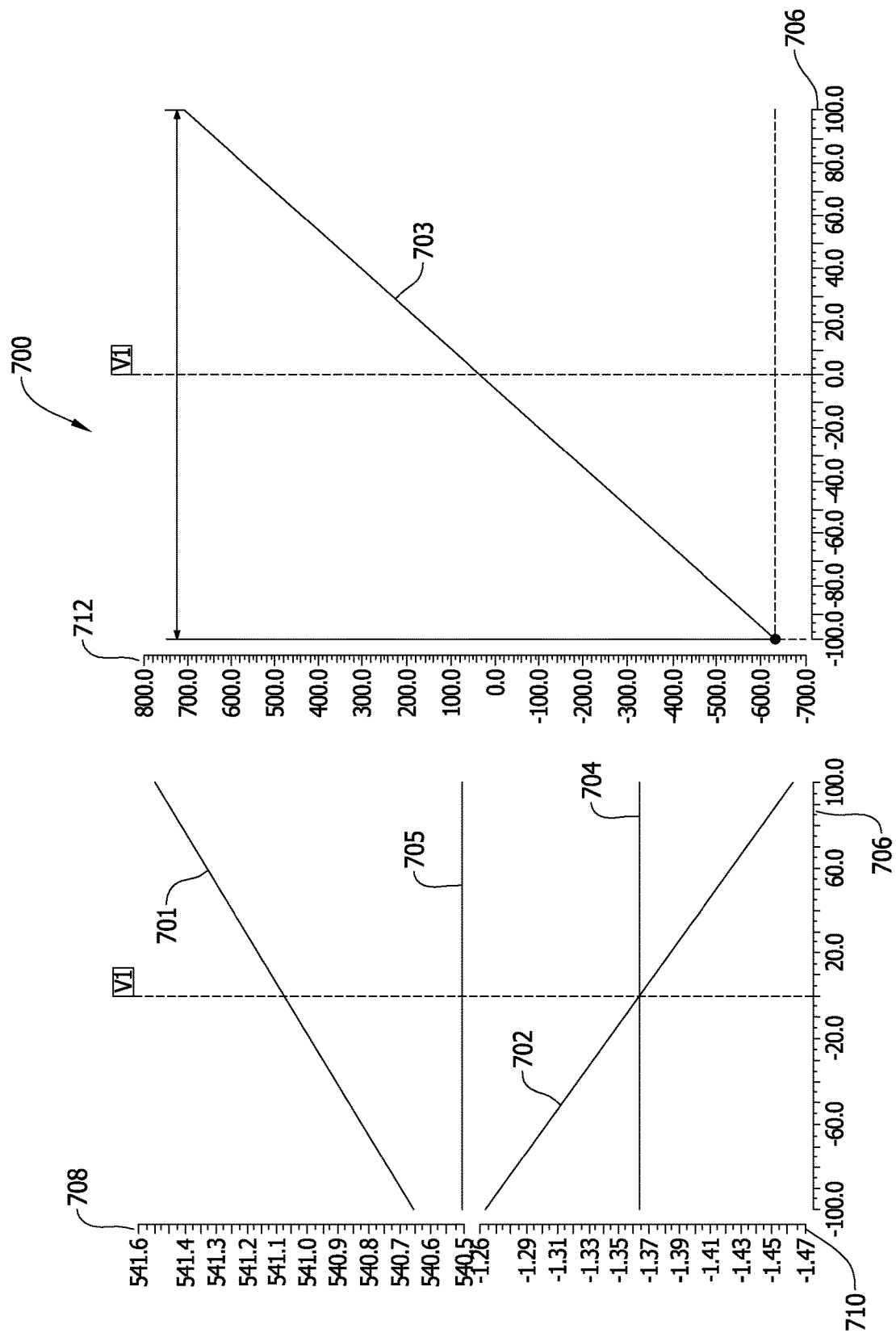
FIG. 3 is a plot of settled steady-state results of a behavioral simulation of the self-optimizing circuit shown in FIG. 2.

FIG. 3 comprises plots 700 of the results of a simulation of self-optimizing circuit 200, shown in voltage on vertical axis, 708, 710, and 712. An arbitrary $V_{GS}$ shift ranging from −100 mV to +100 mV, shown on horizontal axis 706, was imparted on dosimeter transistor 209 of dosimeter 204 to simulate the TID effects on a FD-SOI semiconductor device, such as nMOS semiconductor 101 or pMOS semiconductor 103. A 1:1 linear relationship between the well bias and the same threshold voltage ($V_{TH}$) of the semiconductor device was assumed for simplicity, and a voltage-controlled voltage source was added in series to the same device.

Plots 700 illustrate an original shift in voltage illustrated in plot 701 of the dosimeter voltage 211 from dosimeter 204 and plot 705 of reference voltage 213 from reference circuit 205. Self-optimizing circuit 200 compensates the original shift when a bias 702 is supplied to the well of the semiconductor device 209. The bias 702 applied to the well is in addition to the optimized static nominal voltage 704 applied to the well. The latter voltage would have been set upon the initial calibration of dosimeter 204 and reference circuit 205.

Plot 703 shows the residual shift still present after the compensation enacted by the self-optimizing circuit on the $V_{GS}$ of the dosimeter transistor 209. Again, assuming a 1:1 impact over the gate voltage effected by a back-bias well voltage modulation, out of ±100 mV only a total of ~1.3 mV residual shift remains (plot 703), showing >40 dB rejection of circuit 200.

Figure 4:
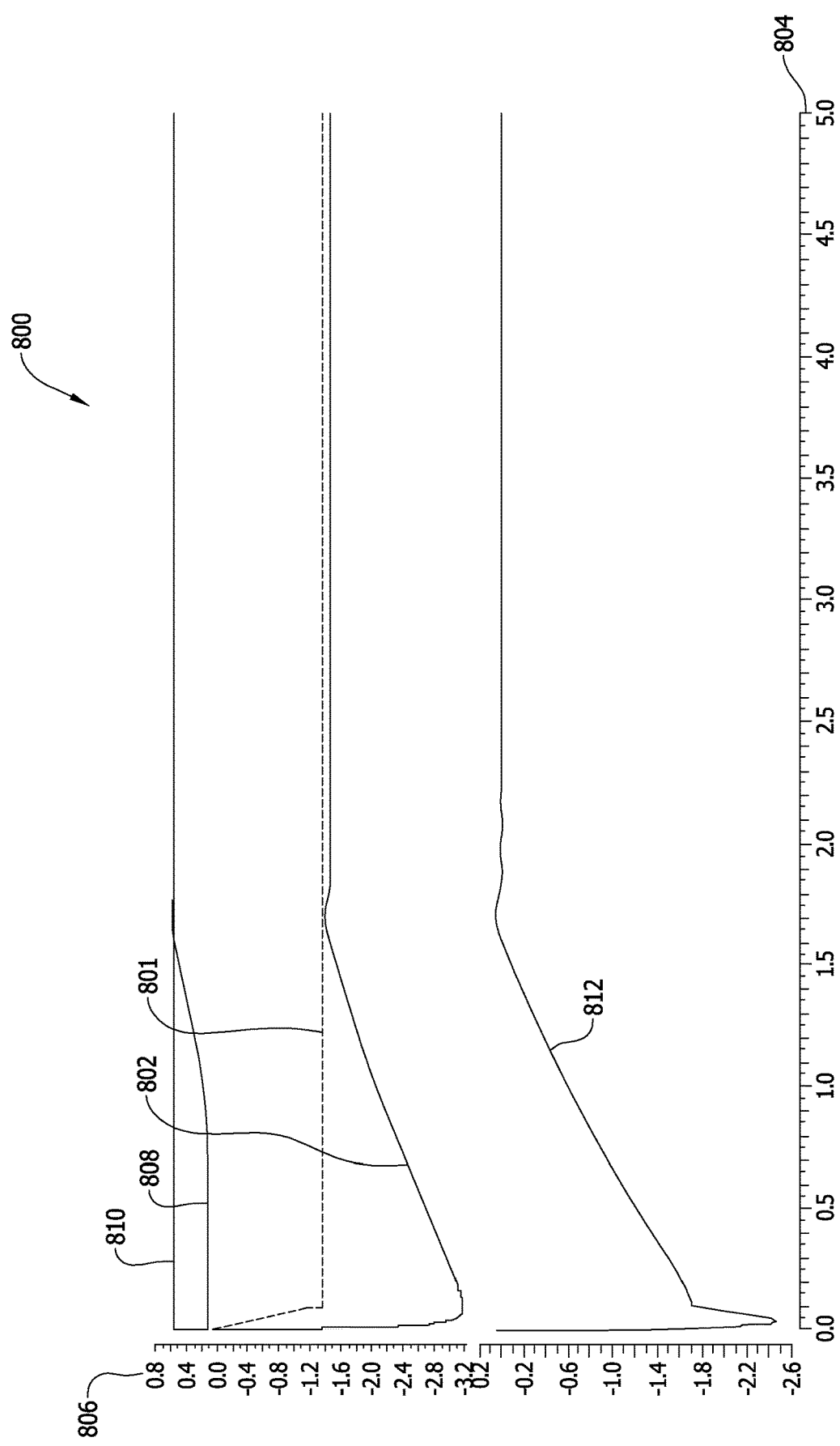
FIG. 4 is a plot of initial transient settling of the self-optimizing circuit shown in FIG. 2.

FIG. 4 is a plot 800 of the initial settling of self-optimizing circuit 200. Plot 800 shows voltage represented by a vertical axis 806 and expressed in Volts, versus time represented on the horizontal axis 804 and expressed in microseconds. The initial settling of self-optimizing circuit 200 was simulated without initial conditions, when charge pump 202 had already settled down to −3.4V, for example. The simulation was conducted assuming a small (approximately 100 fF) local well capacitance, a 60 dB OTA gain with Gain-Bandwidth Product (GBWP) of 1 Megahertz (MHz), followed by the driving stage of the LDO, and showed excellent stability. However, if a larger well under a large circuit was closed in the same loop, ringing on all waveforms could worsen. The stability test results shown in FIG. 4 indeed can be used to mimic the recovery of self-optimizing circuit 200 after an ion strike. In the simulation for which results are shown in FIG. 4, the well beneath FD-SOI transistor 209 is separated from the wells beneath the devices under optimization, because the larger charge collection area, augmented by funnel effects beyond the BOX, may partially negate the SOI insulation benefit. Generally, ion strikes would still affect LDO regulator 221, but at least would have less impact on the stability of the loop, nor engender long-duration ringing.

The final settling of the potential of the well beneath the device under optimization is shown as plot 802, which is shifted by greater than −99 mV from the original well voltage state (a constant shown in plot 801, for ease of comparison). The shift in the differential output from dosimeter 204 and from reference circuit 205 are shown by plot 808 of dosimeter voltage 211, and plot 810 of reference voltage 213. Accordingly, plot 812 of residual shift in $V_{GS}$ illustrates almost complete compensation of a 100 mV shift. Therefore, assuming 1:1 impact over $V_{TH}$, in the simulation whose results are shown in FIG. 4, only ~0.7 mV residual shift in the $V_{GS}$ remains from an original value of +100 mV equivalent $V_{TH}$ shift imparted on FD-SOI transistor 209 in dosimeter 204.

Figure 5:
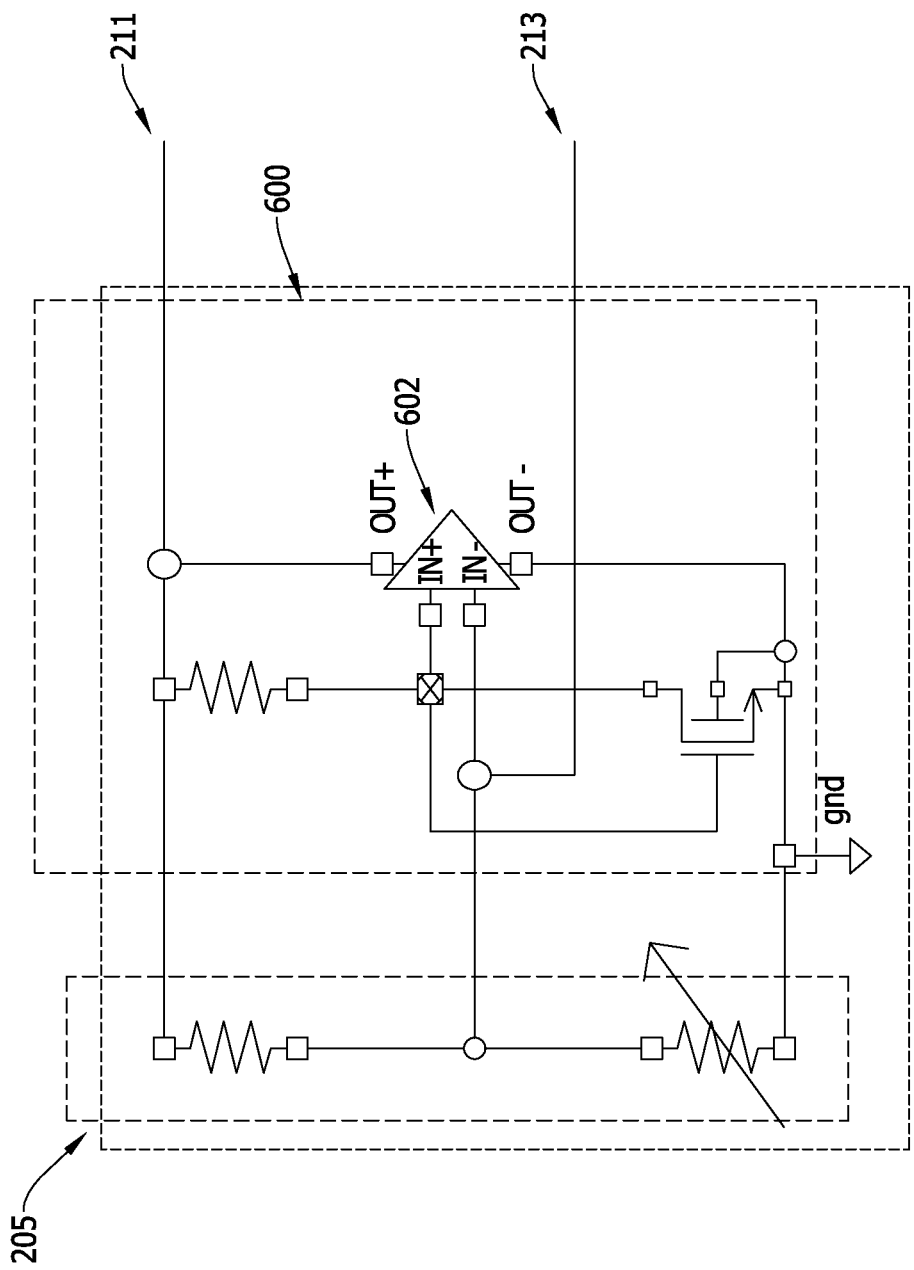
FIG. 5 is a schematic diagram of another embodiment of a dosimeter for use in the self-optimizing circuit shown in FIG. 2.

FIG. 5 is a schematic diagram of another embodiment of a dosimeter 600. Dosimeter 600 is substantially similar to dosimeter 204 with the addition of an amplifier 602, and connection of the resistive bridge to the output of amplifier 602 rather than to the supply VDD. Similar to the embodiment shown in FIG. 2, reference circuit 205 and dosimeter 600 are coupled in a bridge configuration such that a differential voltage is supplied to an input of amplifier 602. The output of amplifier 602 then becomes the dosimeter voltage output 211, and another reference circuit, such as reference circuit 205, likewise provides the reference voltage 213 to OTA 206 (shown in FIG. 2). Notably, the resistors at the top of the bridge, or matched PMOS loads in the alternative, provide independence from supply variations by virtue of the amplifier's Power Supply Rejection (PSR) characteristics.

In another alternative implementation, dosimeter 204 may include inverter structures combining N and P FETs, rather than a single FD-SOI transistor. The single or multiple wells are still tuned continuously in such an implementation, but may require one or more feedback loops with LDO driving stages similar to LDO regulators 221 and replica LDO driver stage 231. Such inverter structures would function as combined N/P shift monitors, for example, for applications where a more punctual discrimination N vs. P shift dosimetry may not be required. In yet another alternative implementation, oscillator type sensors, referred to as "silicon odometers," can be used. In such embodiments, rather than by more commonplace digital counters, the frequency of the oscillator-type sensors is converted back to current by way of a frequency-to-current converter, fed into a resistor or resistive divider, and used to generate a voltage analog error signal analogous to the one described for dosimeter 204.

In yet another alternative implementation, an oscillator-based dosimeter may be implemented by enclosing a ring oscillator into a voltage reference with a topology similar to dosimeter 600, but with dynamically tunable resistors, that has been designed to emphasize TID effects. This dosimeter embodiment is very compact, and automatically generates a voltage as a function of frequency. Also, as opposed to NMOS+PMOS complementary inverters, purely NMOS and/or PMOS-based inverter structures can be included in the ring, to construct an oscillator that is sensitive to N- and P-TID only; and therefore, the loop can be driven for the separate optimization of different wells.

If a diode and a resistor network are included in a voltage reference loop to act as a dosimeter, as shown in dosimeter 600, an additional TID shift amplification can be built into the TID mitigation loop of the self-optimizing circuit. This increases the loop gain, and ultimately the efficacy of self-optimizing circuit 200 in minimizing, or compensating for, radiation variations. Since supply voltage VDD can be subjected to a lot of interference in a large IC, constructing a supply-independent dosimeter that exploits the high PSR of an amplifier also enables a much cleaner operation of self-optimizing circuit 200, which otherwise would be led to track spurious supply transients, rather than long-term TID, aging, and temperature drifts.

The configuration of dosimeter 600 (shown in FIG. 5) including a diode (rather than switched-capacitor resistors, as more suited to oscillator-based dosimeters), and retaining matched resistors on the top branches as illustrated in FIG.

Figure 6:
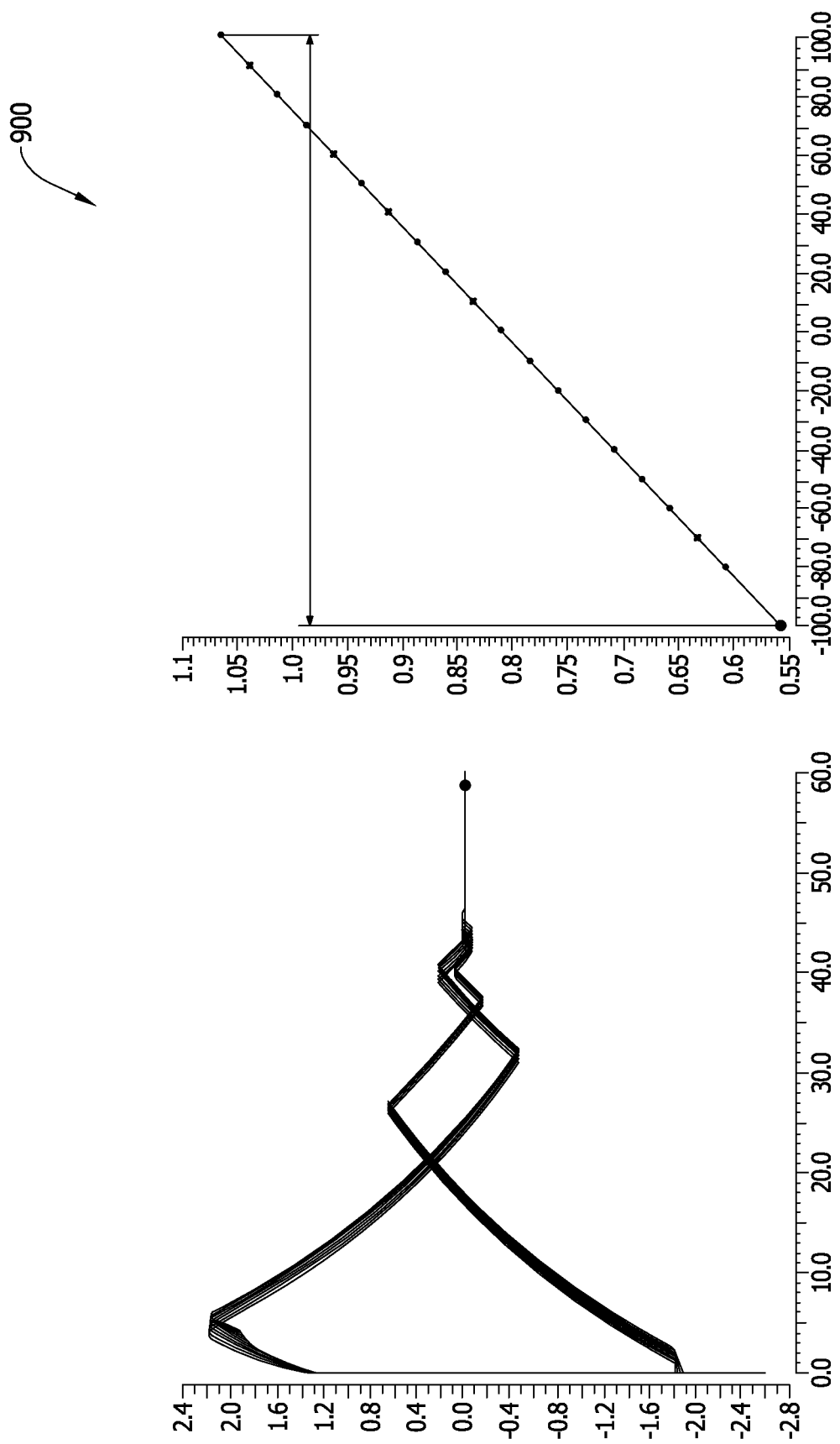
FIG. 6 is a set of plots showing the results of a simulation for a transient condition of a self-optimizing circuit including the dosimeter shown in FIG. 5, and the settled steady-state results of the same.

5, was simulated in the same fashion used to generate plots 700 shown in FIG. 3. FIG. 6 is a plot 900 of the simulation results of an initial transient of the TID compensation loop, including the dosimeter shown in FIG. 5. The transient settling is less stable than the corresponding trajectories in FIG. 4, reflecting the additional gain contribution of the local loop that has been added through dosimeter 600. Specifically, the local feedback topology shown in FIG. 5 includes a single-pole limitation imposed by the GBWP of the amplifier. The added singularity would contribute to destabilize the overall circuit. However, a Miller zero in LDO regulator 221 of self-optimizing circuit 200 shown in FIG. 2 retains stability (e.g., within 60 µs), as displayed in FIG. 6. As a beneficial counterpart to this trade-off, the slope of the dosimeter output more than doubles, as compared to the same identical open-loop dosimeter built with resistors and an NMOS FET. This leads to a tighter effect mitigation by self-optimizing circuit 200. For example, rather than 1.3 mV variability upon ±100 mV VTH change, dosimeter 600 closed in the loop now yields only 510 µV shift, or 52 dB rejection of TID shifts. While an additional dosimeter amplifier 602 must be included, it also helps significantly reduce the sensitivity to supply shifts of dosimeter 600. Incidentally, if so desired, dosimeter 600 can be designed to desensitize the response to temperature variations of self-optimizing circuit 200.

Self-optimizing circuit 200 may also be used to counter aging mechanisms, or other effects. The effects of oxide and channel lattice degradation in FET devices over time tend to shift the performance of circuits in at least a similar fashion as described with respect to radiation (which can be considered an "accelerated aging" equivalent mechanism). Such similarities support an effectiveness of self-optimizing circuit 200 to counter aging drifts as well as radiation drifts. That is, once the dosimeter (or, more properly in this new context, the "reference circuit") drifts away from its nominal setting initially established in the factory, the loop will attempt to correct for the shift acting on the back-bias, regardless of its origin. Rather than a TID dosimeter sensor, in this implementation, self-optimizing circuit 200 includes an "odometer" such as, for example, a ring oscillator. Additional circuitry may be designed, for example, around a frequency synthesizer inside the loop, to generate an output voltage with high sensitivity to the frequency of the oscillator, thus a sensitivity to aging effects.

Similarly, self-optimizing circuit 200 may also compensate for temperature drift effects. The temperature drift imparted on the dosimeter, or "reference circuit," would determine an error signal used to steer the well bias control to correct the shift.

Notably, the TID effects trap charge at the interface of the BOX, and the electric field engendered by the charge is physically countered by an opposite field, i.e., the one the self-optimizing circuit activates by moving an opposite quantity of charge in the underlying well (slightly adjusted to account for surface dielectric and geometrical discrepancies between the trapped charge and the countering charge). Accordingly, an undesirable effect is compensated directly by a reaction on the same physical quantities, i.e., the charge at or beneath BOX 104. All electrical effects, or parametric shifts, caused by the original TID will thus be compensated for by a dynamically regulated counterbalance of the original trapped charge, rather than by a compensation of its symptoms only.

Aging effects result in structural modifications of the gate oxide or of the underlying carrier channel lattice as determined by silicon "wear-out." Temperature drifts include work function shifts and depletion region thickness modulation. Neither of these processes reflects physical modifications of a well potential, such as that applied to wells 116 and 117 shown in FIG. 1. Therefore, unlike TID compensation techniques, these effects are compensated by a "proxy" electrical reaction that leads to an indirect compensation of their symptoms through a different mechanism, while the original sources of drift are not physically reversed. In certain embodiments, dosimeters may be selected that are sensitive to TID only, or to TID and aging, but, e.g., can be made insensitive to supply voltage variations, as well as (less commonly) to temperature variations.

The compensation methods described herein efficiently and adaptively optimize the operation of FD-SOI circuits, in particular of sensitive analog circuits dependent on the optimized performance of NMOS FETs and PMOS FETs, against at least TID, temperature, and aging, as opposed to traditional static guard-banding and its subsequent, undesirable necessity for over-designed circuits.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A self-optimizing circuit for a primary fully-depleted silicon-on-insulator (FD-SOI) device having a buried oxide layer (BOX) and a primary well disposed beneath the BOX, the self-optimizing circuit comprising:
    a static biasing circuit configured to supply a first bias;
    a total ionizing dose (TID) dosimeter comprising a dosimeter FD-SOI device, wherein the TID dosimeter is configured to generate a dosimeter voltage representing parametric shifts in the primary FD-SOI device;
    a reference circuit configured to supply a reference voltage;
    an amplifier coupled to the TID dosimeter and the reference circuit, wherein the amplifier is configured to supply a second bias at an output of the static biasing circuit, and wherein the second bias is proportional to a difference between the dosimeter voltage and the reference voltage;
    a voltage source configured to generate a drive voltage to which the first bias and the second bias are referenced; and
    a feedback circuit configured to regulate supply of the drive voltage applied to a well of the dosimeter FD-SOI device based on a combination of the first bias and the second bias.

2. The self-optimizing circuit of claim 1, wherein the amplifier is an operational transconductance amplifier.

3. The self-optimizing circuit of claim 1, wherein the feedback circuit comprises a low-drop out (LDO) regulator configured to regulate the drive voltage applied to the well of the dosimeter FD-SOI device based on the combination of the first bias and the second bias.

4. The self-optimizing circuit of claim 3, wherein the static biasing circuit comprises an amplifier configured to supply the first bias based on a differential input provided by a reference and a feedback of the LDO regulator.

5. The self-optimizing circuit of claim 1, wherein the feedback circuit is further configured to regulate the drive voltage applied to the primary well of the primary FD-SOI device.

6. The self-optimizing circuit of claim 1, wherein the reference circuit and the TID dosimeter are coupled in a bridge configuration.

7. The self-optimizing circuit of claim 6, wherein the reference circuit comprises a calibration resistor opposite the dosimeter FD-SOI device.

8. The self-optimizing circuit of claim 6, wherein the TID dosimeter comprises an operational amplifier configured to:
   amplify the difference between the dosimeter voltage and the reference voltage; and
   provide rejection of supply voltage variations experienced by the TID dosimeter and the reference circuit.

9. The self-optimizing circuit of claim 1, wherein the voltage source comprises a charge pump operated by a clock.

10. The self-optimizing circuit of claim 1, wherein the voltage source comprises a level-shifting servo driver.

11. The self-optimizing circuit of claim 1 further comprising a coupling between the well of the dosimeter FD-SOI device and the primary well of the primary FD-SOI device, wherein the coupling is configured to link the drive voltage applied to the well of the dosimeter FD-SOI device and the drive voltage applied to the primary well of the primary FD-SOI device.

12. The self-optimizing circuit of claim 1 further comprising a switch coupled between the well of the dosimeter FD-SOI device and the primary well of the primary FD-SOI device, wherein the switch is configured to optionally provide a coupling to link the drive voltage applied to the well of the dosimeter FD-SOI device and the drive voltage applied to the primary well of the primary FD-SOI device.

13. A method of compensating a primary fully-depleted silicon-on-insulator (FD-SOI) device for total ionizing dose (TID) effects, the primary FD-SOI device having a buried oxide layer (BOX) and a primary well disposed beneath the BOX, the method comprising:
   determining a static bias;
   detecting, by a TID dosimeter, a parametric shift in the primary FD-SOI device and generating a differential output representative thereof;
   determining a dynamic bias based on the differential output;
   supplying a drive voltage based on the static bias and the dynamic bias;
   regulating the drive voltage based on the static bias and the dynamic bias;
   applying the static bias and the dynamic bias to a well of a FD-SOI device of the TID dosimeter; and
   applying the static bias and the dynamic bias to the primary well of the primary FD-SOI device.

14. The method of claim 13, wherein said applying the static bias and the dynamic bias to the primary well of the primary FD-SOI device comprises coupling the well of the FD-SOI device of the TID dosimeter to the primary well of the primary FD-SOI device.

15. The method of claim 13, wherein said detecting the parametric shift in the primary FD-SOI device comprises measuring the parametric shift in the FD-SOI device of the TID dosimeter, and wherein said generating the differential output comprises providing a dosimeter voltage and a reference voltage.

16. The method of claim 15, wherein said providing the dosimeter voltage comprises amplifying a difference between the dosimeter voltage and the reference voltage.

17. The method of claim 13, wherein said determining the dynamic bias comprises controlling a first operational transconductance amplifier (OTA) using the differential output to produce a dynamic bias for use in said regulating the drive voltage to produce the dynamic bias.

18. The method of claim 17, wherein said regulating the drive voltage comprises controlling a low-dropout (LDO) regulator based, at least in part, on the dynamic bias produced by the first OTA, a static bias produced by a second OTA, and a feedback based on the static bias and the dynamic bias applied to the well of the FD-SOI device of the TID dosimeter.

19. The method of claim 13, wherein said supplying the drive voltage and said regulating the drive voltage comprises analog-only signal processing governed by components substantially invariant to TID.

20. The method of claim 13, wherein said supplying the drive voltage comprises operating a charge pump using a clock.

* * * * *